United States Patent

Toyoda et al.

[11] Patent Number: 5,958,841
[45] Date of Patent: Sep. 28, 1999

[54] CIRCUIT DEVICE FOR DRIVING A SQUID MAGNETOMETRIC SENSOR AND EVALUATING SQUID CHARACTERISTICS

[75] Inventors: Haruhisa Toyoda; Tatsuoki Nagaishi; Hideo Itozaki, all of Hyogo, Japan

[73] Assignee: Sumitomo Electric Industries, LTD., Osaka, Japan

[21] Appl. No.: 08/953,700

[22] Filed: Oct. 17, 1997

[30] Foreign Application Priority Data

Oct. 17, 1996 [JP] Japan ................................ 8-295758

[51] Int. Cl.⁶ .......................... G01R 33/035; G01R 35/00
[52] U.S. Cl. ......................... 505/162; 324/235; 324/248; 505/846
[58] Field of Search .................... 324/235, 248; 505/162, 846

[56] References Cited

U.S. PATENT DOCUMENTS

| | | | |
|---|---|---|---|
| 4,004,217 | 1/1977 | Giffard | 324/248 |
| 4,389,612 | 6/1983 | Simmonds et al. | 324/248 |
| 5,231,353 | 7/1993 | Nakayama et al. | 324/248 |
| 5,280,242 | 1/1994 | Odawara et al. | 324/248 |

OTHER PUBLICATIONS

Forgacs et al., "Lock–On Magnetometer Utilizing a Superconducting Sensor" *IEEE Transaction on Instrumentation and Measurement*, vol. IM–15, No. 3, Sep. 1966, pp. 113–120.

Wellstood et al., "Integrated dc SQUID magnetometer with a high slew rate" *Rev. ScI. Instrum.*, vol. 55, No. 6, Jun. 1984, pp. 952–957.

*Primary Examiner*—Gerard Strecker
*Attorney, Agent, or Firm*—Foley & Lardner

[57] ABSTRACT

A circuit device for driving a SQUID magnetometric sensor. This device includes an FLL magnetometer circuit for driving the SQUID with an AC signal as a magnetometric sensor, an evaluator circuit for evaluating the SQUID characteristics, and a selector circuit for selecting a sensor function or an evaluator function. When the selection circuit selects one of the sensor and evaluator functions, only one of magnetometer and evaluator circuits is activated. Therefore, the circuit device can act alternatively as either a sensor or an evaluator.

16 Claims, 3 Drawing Sheets

CIRCUIT DEVICE FOR DRIVING A SQUID MAGNETOMETRIC SENSOR AND EVALUATING SQUID CHARACTERISTICS

BACKGROUND OF THE INVENTION

1. Field of the Invention

The present invention relates generally to a circuit device for driving a magnetometric sensor, and relates particularly to a circuit device for driving a SQUID (superconducting quantum interference device) which is used as a magnetic flux or field sensor.

2. Description of Related Art

A SQUID is a highly sensitive magnetometric sensor which can measure extremely small magnetic fields, and is usually provided with a magnetic flux locked loop, a so-called "FLL", in order to drive the SQUID acting as a magnetometric sensor. The driver circuit with the FLL uses a null balance method. In the driver circuit, a feedback signal obtained from a voltage signal detected by the SQUID is returned through an exciting coil to the SQUID and the operating point of the SQUID is automatically null-balanced to be locked at a trough or crest point of SQUID voltage (V) vs. magnetic flux ($\Phi$) characteristics, thereby a magnetic field measurement signal is obtained from the feedback signal.

On the other hand, for a SQUID element itself, the SQUID element has various fundamental operating characteristics such as voltage-current (V-I) characteristics, the above mentioned V-$\Phi$ characteristics, or the like, and accordingly is verified or evaluated using these characteristics.

In addition, if a SQUID is formed with a high-temperature superconductor such as an oxide superconducting compound, the SQUID is allowed to operate at a relatively high temperature $-196°$ C. of liquid nitrogen (N), and accordingly to be handled easily. Accordingly, the system handling this high-temperature type of SQUID is remarkably simplified in contrast with a system using liquid helium (He) at a very low operating temperature of $-269°$ C.

Therefore, the high-temperature type of SQUID is expected to be developed and utilized in various applications, such as medical diagnosis, non-destructive testing, food inspection, geological survey, and the like, and many researchers will research and develop applications of the SQUID. However, in order to research and develop the applications in practice, it is necessary for these researchers to obtain a SQUID using a high-temperature superconductor, and so there is a hope for an easily available and experimental high-temperature superconducting SQUID.

SUMMARY OF THE INVENTION

If there is a device which not only can drive a SQUID as a sensor for magnetic measurement but also can evaluate fundamental characteristics of the SQUID element itself used as the magnetometric sensor, basic understanding of SQUID characteristics for the above research and development can be also provided by the device.

Further, if such device is made into a kit with small size, simplicity and reliability, many researchers or developers over a wide field can be provided with the devices, so that the device would contribute to the research and development applying the SQUID to various magnetic measurements.

Accordingly, the present invention starts from these points of view and provides a SQUID driver circuit which can satisfy the above requirements. The present invention employs the feedback coil of an FLL for applying a certain magnetic field to the SQUID in order to obtain the element's characteristics for evaluation, such as SQUID voltage (V) vs. magnetic flux ($\Phi$) characteristics.

Therefore, an object of the present invention is generally to provide a small-sized circuit device of practical use, which not only can drive a SQUID as a sensor for magnetic measurement but also can evaluate fundamental characteristics of the SQUID element itself used as the magnetometric sensor in an alternative fashion.

The present invention provides particularly a compact circuit device that can independently operate a magnetometer circuit portion for driving a SQUID as a magnetometric sensor and an evaluator circuit portion for evaluating characteristics of the SQUID element itself, in which no malfunctions are caused by interference of the driver and evaluator circuit portions with each other, and that further does not require a physical means for electromagnetical shielding between these circuit portions.

Furthermore, another object of the present invention is to provide a circuit device in which not only operating characteristics of a SQUID element itself can be verified or evaluated visually in practice but also a feedback coil used in FLL is used as a magnetic flux producing coil for applying a magnetic field to the SQUID element in order to obtain the element's characteristics such as $\Phi$-V characteristics. Consequently, by using a small-sized SQUID probe therewith, a good grasp of the fundamental SQUID's characteristics necessary for research and development of magnetic measurement applications, such as physical measurement, non-destructive testing, biomagnetic measurement, and the like, is enabled.

Therefore, according to the present invention, the above and other objects are achieved by a circuit device for driving a SQUID magnetometric sensor including a FLL magnetometer circuit for driving the SQUID with an AC signal as a magnetometric sensor, an evaluator circuit for evaluating the SQUID characteristics and a selector circuit for selecting either a sensor function or an evaluator function, only one of the magnetometer and evaluator circuits being activated when the selection circuit selects one of the sensor function and evaluator function. Consequently, the circuit device can act alternatively as either a sensor or an evaluator.

In order to realize a circuit device having both a magnetometric sensor function and an element evaluator function for a SQUID, it is preferable that a magnetometer circuit of magnetic flux modulation type and an evaluator circuit of the SQUID element for implementing these functions are formed independently as circuits without having a common circuit part to make the design of the device easy and the circuit device reliable. For example, these circuits may be physically separated, for example, placed on two substrates respectively, so that the circuits operate independently of each other.

In general, in a circuit for evaluating a SQUID element characteristics, operating characteristics of SQUID element such as SQUID voltage (V) vs. current (I) characteristics and voltage (V) vs. magnetic flux ($\Phi$) characteristics are verified or evaluated using an AC signal of low frequency, for example, in the order of ten Hz (Hertz). On the other hand, in a magnetometer circuit with FLL of magnetic flux modulation type, an AC signal of high frequency, for example, in the order of several or tens of kHz (kilo-Hertz) drives the SQUID to obtain a magnetic field measurement signal.

Therefore, if these circuits for the same SQUID are provided in separated places, there are no interference problems. However, if these circuits are put together into one device, the AC signals of different kinds of frequencies existing within the device acts as noise sources between the circuits and harmfully affect each other. To eliminate these effects, an electromagnetic shield may be provided between the circuits, however, the device becomes large-sized if this shield is adopted.

According to the present invention, there is provided a selector circuit in a device, in addition to a magnetometer circuit and an evaluator circuit. The selector circuit has the capability to activate only one of the magnetometer and evaluator circuits depending upon selecting one of the sensor and evaluator functions, to generate only one AC signal necessary for the selected function and not to generate the other AC signal used for the non-selected function so as to prevent noise generation, thereby the non-selected one of the circuits does not exert its own AC signal on the other circuit and the device is allowed to be simplified in structure and small-sized.

An activated state of a selected one of the circuits according to the present invention is typically realized by applying voltage to the selected circuit from its power source, while power supply remains disconnected to the other circuit non-selected. Accordingly, when one circuit is activated to implement its corresponding function, an AC signal affecting the circuit is not generated by the other circuit. In order to ensure this prevention function, the power terminal of the non-selected circuit is preferably not only disconnected from the power supply but also grounded.

According to the present invention, further, transmitting terminals are provided within first and second input/output terminals for sending and receiving signals between a SQUID probe and the magnetometer and evaluator circuits, so that these transmitting terminals are allowed to apply exciting signals to an exciting coil within the SQUID probe. The coil receives a feedback signal from the magnetometer circuit to operate mainly as a feedback coil, as well known, when the magnetometer circuit is selected by the selector circuit. In the present invention, the coil also receives the magnetic flux producing signal from the evaluator circuit to obtain required characteristics such as V-Φ, when the evaluator circuit is selected. Therefore, a magnetic field applying coil means dedicated to the evaluator circuit is not required in order to obtain these characteristics.

According to another feature of the present invention, the first and second input/output terminals are formed by connector receptacles with the capability of tight connection to various types of SQUIDs. Further, evaluation output terminals are also formed by connector receptacles to receive the terminal of signal cables connected to a suitable graphic display or indicator means, for example, an oscilloscope. Thereby, the device may be used to display on screen the characteristics of the SQUID element, such as V-I, V-Φ, or the like, for evaluating operating parameters of the SQUID element or for training educationally for SQUID research.

The above and other objects, features and advantages of the present invention will be apparent from the following description of preferred embodiments of the present invention with reference to the accompanying drawings.

DETAILED EXPLANATION OF THE INVENTION

Outline of the Structure

Figure 1:
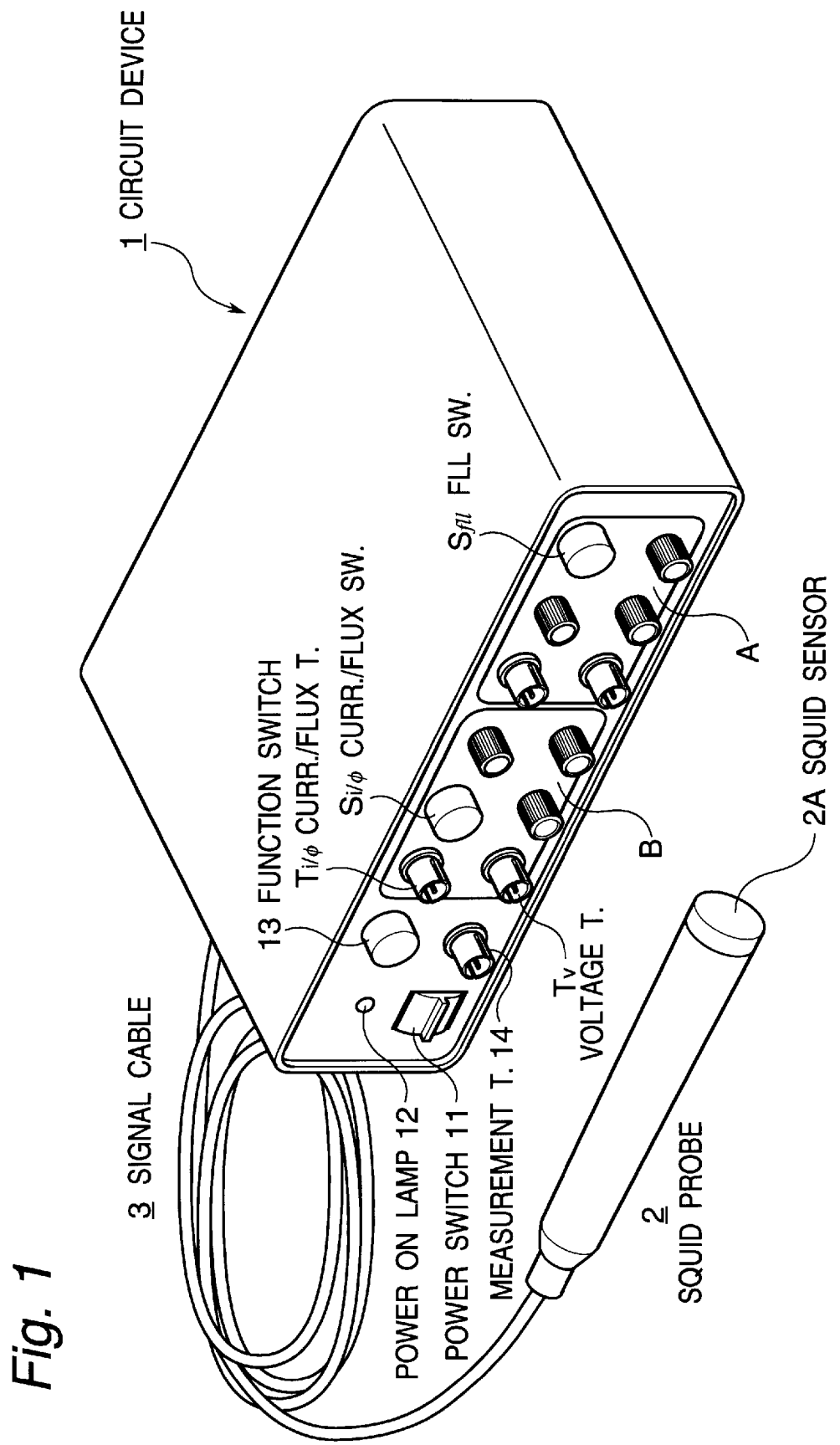
FIG. 1 shows a general perspective view of a structure according to an embodiment of the present invention.

Referring to FIG. 1, a circuit device 1 for driving a SQUID according to one embodiment of the present invention is shown in perspective with a SQUID probe 2 which is used in conjunction with the circuit device 1. The circuit device has comparatively small size, for example, 200 mm (millimeters) wide (frontage), 160 mm long (depth) and 60 mm high, and compactly contains a magnetometer circuit, an element evaluator circuit and a selector circuit as explained hereinafter.

On the front panel of the circuit device 1, there are provided a power source switch 11, a power on lamp 12, a function switch means 13 for changing functions, such as a push button switch of two-position type, a measurement output terminal 14 which is formed by a connector receptacle to pick up a magnetic measurement signal, and the like. The measurement signal from the terminal 14 is transmitted through a signal cable (not shown) to an external display means such as a magnetic flux or field recorder, meter or indicator to indicate measured results.

On the front panel, there are also two set regions A and B for setting sensor and evaluator functions. The first region A is used to set parameters mainly when the sensor function is selected by the function switch means 13 to activate the magnetometer circuit within the circuit device 1. On the other hand, the second region B is used to set parameters mainly when the evaluator function is selected by the switch means 13 to activate the evaluator circuit within the circuit device 1.

In the first region A for setting sensor function, for example, there is also provided an FLL lock/reset switch means $S_{fll}$, such as a push button switch of two-position type, for the lock or reset of magnetic flux locked loop (FLL) in the magnetometer circuit. In this region A, there are also provided detection signal output terminals for transmitting magnetic flux and voltage detection signals for observation using suitable meters, and knobs for controlling sensor parameters, such as bias current, magnetic flux, and the like.

In the second region B for setting the evaluator function, for example, there are provided output terminals Ti/φ and Tv formed by connector receptacles for transmitting characteristics evaluation signals (I/Φ, V) necessary for displaying voltage vs. current (V-I) characteristics and voltage vs. magnetic flux (V-Φ) characteristics. In this region B, there are also provided a current/flux switch means Si/φ, such as a push button switch of two-position type, for changing the output signals between current signal (I) and magnetic flux signal (Φ), and knobs for controlling evaluation parameters, such as current, magnetic flux, and the like. These characteristics evaluation signals (I/Φ, V) are transmitted through the signal cable (not shown) to a graphic display, such as an oscilloscope, to visually display graphical curves of the V-I and V-Φ characteristics In addition, on the back panel of the circuit device 1, for example, there are provided first and second input/output terminals formed by connector receptacles for receiving a terminal of a signal cable 3, and a power source terminal for supplying DC voltages, for example, +15 Volts and −15 Volts. A SQUID probe 2 is allowed to be connected selectively to the first and second input/output terminals through the cable 3.

The SQUID probe 2, shaped in the form of a long cylinder as shown in FIG. 1, has a SQUID sensor 2A capable of being connected and removed from the end opposite the end to which the signal cable 3 is connected. The SQUID sensor 2A has a SQUID element and an exciting coil provided therewith as main elements. The sensor may be formed by mounting the SQUID element and the exciting coil with resin molding on a chip carrier having a diameter of 17 mm, and by covering them with a cap. The resin molding provides easy handling of the SQUID sensor, and long use for a very large number of times, for example, hundreds of times.

The SQUID element may be a high-temperature superconducting SQUID in which a thin film of HoBaCuO is formed on a substrate made of $SrTiO_3$ using a laser deposition technology. The heart of the SQUID element is a superconducting junction which is formed by depositing the superconducting thin film on the substrate having a step of 0.2 $\mu$m (micrometers). This kind of SQUID element provides advanced performance at high resolution, for example, one fifty-millionth ($2\times10^{-8}$) of earth magnetism.

Detail of the Circuits

Figure 2:
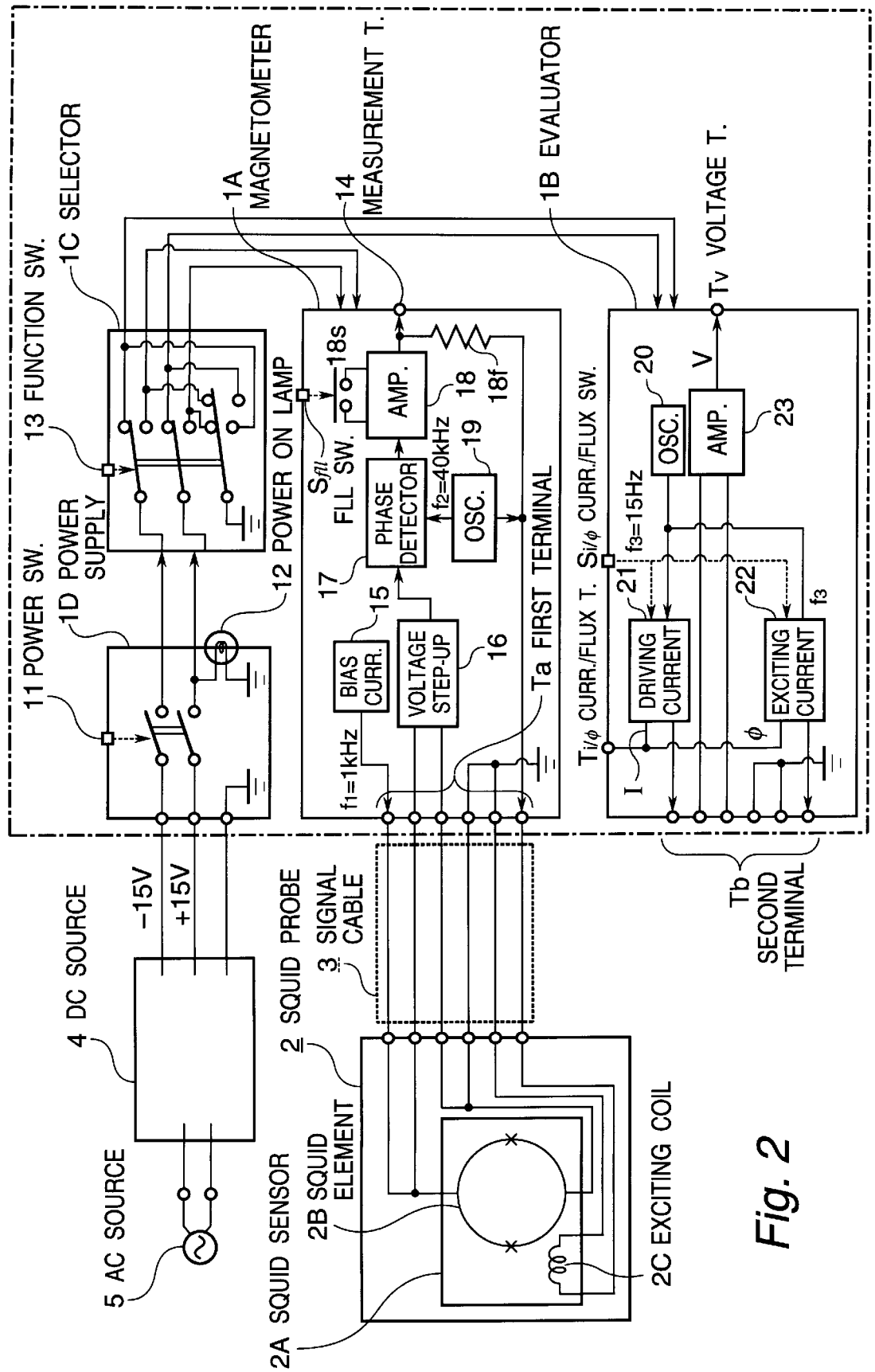
FIG. 2 shows a schematic circuit block diagram according to an embodiment of the present invention.

Now referring FIG. 2, a schematic circuit block diagram of the circuit device according to one embodiment of the present invention is shown with the SQUID probe 2 used in conjunction with the circuit device. The circuit device is an electronic circuit including a magnetometer circuit 1A, an evaluator circuit 1B, a selector circuit 1C and a power supply circuit 1D.

The magnetometer circuit 1A is provided with a so-called "FLL" to drive the SQUID probe 2 as a magnetometric sensor with magnetic flux modulation. For this purpose, the circuit 1A comprises a bias current source circuit 15 for generating an AC bias current to the SQUID having a relatively high frequency $f_1$, for example, 1 kHz, a voltage step-up circuit 16 for step-up transforming and amplifying a voltage signal detected by the SQUID, a phase detector 17, a feedback amplifier circuit 18 for producing a magnetic field measurement signal to the measurement output terminal 14, and an oscillator circuit 19 for generating a modulation AC signal having a high frequency $f_2$, for example, 40 kHz. The feedback amplifier circuit 18 is provided with a reset switch 18s operated by the FLL lock/reset switch means $S_{fl}$, and includes a feedback resistor 18f. Additionally, the bias current source circuit 15 is provided to generate a DC bias current.

The evaluator circuit 1B comprises a low frequency source 20 for generating an AC signal of a low frequency $f_3$, for example, 15 Hz, a driving current supply circuit 21, an exciting current supply circuit 22, and a voltage amplifier circuit 23 which amplifies a voltage signal from the SQUID and sends the amplified signal as a voltage signal V to the voltage output terminal Tv. Though the driving current supply circuit 21 and the exciting current supply circuit 22 have the same functions of changing their outputs (I, Φ) to a constant value or an AC signal having the frequency component $f_3$ depending on I/Φ selection by the current/flux switch means Si/φ, these circuits 21 and 22 have their changing actions inverse each other.

Namely, when the evaluator circuit 1B is activated, the driving current supply circuit 21 supplies a driving current to the SQUID, and the exciting current supply circuit 21 supplies an exciting current to an exciting coil 2C within the SQUID sensor 2A. If the current/flux switch means Si/φ is placed at a first position "i", the driving current of the circuit 21 is controlled to vary with the low frequency $f_3$ based on the AC signal from the frequency source 20 and a corresponding current signal I is also sent to the current/flux output terminals Ti/φ. If the switch means Si/φ is placed at a second position "φ", the driving current of the circuit 21 is controlled to have a predetermined constant value. On the other hand, the exciting current of the exciting circuit 22 is controlled to have a predetermined constant value if the switch means Si/φ is placed at the the first position "i". And, if the switch means Si/φ is placed at the second position "φ", the exciting current is controlled to vary with the frequency $f_3$ and a corresponding magnetic flux signal Φ is sent to the output terminals Ti/φ.

The selection circuit 1C is a switch circuit for changing power supply depending on the positions of the function switch means 13. A DC supply voltage, for example, +15 Volts and −15 Volts, is connected to this circuit 1C through the power switch circuit 1D from the external DC source. The circuit 1C applies the DC voltage selectively to the magnetometer circuit 1A or the evaluator circuit 1B, and forces the power supply terminal of non-selected circuit 1B or 1A to be grounded.

The power switch circuit 1D connects and disconnects the DC supply voltage from the DC source to the selection circuit 1C, and turns on and off the power on lamp 12, depending upon the positions of the power switch 11.

The magnetometer and evaluator circuits 1A and 1B are provided with first and second input/output terminals Ta and Tb, respectively, which are allowed to receive one end of the signal cable 3 and mounted on the back panel of the device 1 as explained hereinbefore. The SQUID probe 2 is connected to the other end of the signal cable 3 and provided with the SQUID sensor 2A. The SQUID sensor 2A is capable of putting on and taking off the body of the SQUID probe 2, and includes the SQUID element 2B and the exciting coil 2C, as above mentioned. The SQUID sensor 2A communicates the magnetometer or evaluator circuit 1A or 1B through the signal cable 3 and the first or second input/output terminal Ta or Tb.

In the example shown in FIG. 2, in order to connect a specific SQUID sensor 2A selectively to the magnetometer or evaluator circuit 1A or 1B, the one end of the signal cable is manually operated to be connected selectively to the magnetometer or evaluator circuit 1A or 1B. However, it is also allowed to use switch devices between input/output terminals of the magnetometer and evaluator circuits 1A and 1B and a common input/output terminal for receiving the one end of the signal cable 3. In this case, the switch devices are changed to connect the common terminal to any one of the terminals of the magnetometer and evaluator circuit 1A and 1B depending on the switch means 13.

Further, the DC source 4 converts an AC voltage from a commercial AC source 5 into the DC supply voltage. In this example shown in FIG. 2, the DC source 4 is exterior to the device 1 in order to prevent the circuits 1A and 1B from being affected by the switching operation of the source 4. However, if it is not needed to take account of such harmful effect by this switching, the DC source 4 is allowed to be within the device 1.

Operation

The above mentioned circuit device 1 for driving the SQUID sensor 2A operates as follows.

When the power switch circuit is turned on and the function switch means 13 is placed at the position opposite of that illustrated in FIG. 2 for selecting the sensor function to measure a magnetic field from the exterior of the SQUID probe 2, the selection circuit 1C makes the magnetometer circuit 1A power on and the evaluator circuit 1B power off, and consequently all of the the evaluator circuit 1B, including the frequency source 20, is not activated. At this time, the selection circuit 1C causes the power supply terminal of the evaluator circuit 1B not only to be powered off but also to be grounded, thereby this circuit 1B is forced into a non-activated state.

Therefore, the activated magnetometer circuit 1A is not adversely affected by noise from the AC signal with frequency $f_3$ of the evaluator circuit 1B, and this circuit 1A is allowed to perform reliable sensor operation based on the magnetic flux locked loop of the magnetic flux modulation type using the exciting coil 2C as a so-called "feedback coil", in the well known manner.

Because the SQUID element 2B is driven by the AC bias current of frequency $f_1$ from the bias current source circuit 15, low frequency noise of the SQUID is reduced. Accordingly, on the measurement terminal 14 is produced a magnetic field measurement signal accurately corresponding to the external magnetic field to be measured. In this way, the circuit device 1 causes the SQUID sensor 2A to work as a magnetometric sensor in a high performance If the switch means 13 is placed at the position illustrated in FIG. 2 for selecting the evaluator function, the selection circuit 1C makes the evaluator circuit 1B power on and the magnetometer circuit 1A power off, and consequently all of the magnetometer circuit 1A, including the bias current source circuit 15 and the oscillator circuit 19, is not activated. At this time, the selection circuit 1C causes the power supply terminal of the magnetometer circuit 1A not only to be powered off but also to be grounded, thereby this circuit 1A is forced into a non-activated state.

Therefore, the activated evaluator circuit 1B is not adversely affected by noise owing to AC signals with frequencies $f_1$ and $f_2$ of the evaluator circuit 1B, thereby this circuit 1B is allowed to perform reliable evaluator operations depending on the selected positions of the current/flux switch means Si/φ.

In the evaluator circuit 1B, if the switch means Si/φ is placed in the first position "i", the exciting current supply circuit 22 supplies a constant exciting current to the exciting coil 2C within the SQUID sensor 2A to apply a certain magnetic field to the SQUID element 2B, while the driving current supply circuit 21 supplies a driving current varying with the frequency $f_3$ to the SQUID element 2B, as well as sending a sweeping current signal I corresponding to the driving current to the current/flux output terminal Ti/φ in order to sweep a voltage detection signal V with the signal I in a monitor. Thus, the voltage amplifier circuit 23 produces the voltage detection signal V to the voltage output terminal Tv, owing to a voltage signal detected by the SQUID element 2B. Then, the sweeping current signal I and the voltage detection signal V are provided to the monitor, such as an oscilloscope (not shown), and this allows observation of voltage vs. current (V-I) characteristics of the SQUID element 2B, for example, as shown in FIG. 3-A, on the screen of the oscilloscope.

On the other hand, if the switch means Si/φ is placed in the second position "φ", the driving current supply circuit 21 supplies a constant driving current to the SQUID element 2B, while the exciting current supply circuit 22 supplies an exciting current varying with frequency $f_3$ to the exciting coil 2C, as well as sending a sweeping magnetic flux signal Φ corresponding to the exciting current to the output terminal Ti/φ in order to sweep a voltage detection signal V with the signal Φ in the oscilloscope acting as a monitor. Thus, the voltage amplifier circuit 23 produces the voltage detection signal V to the voltage output terminal Tv, owing to a voltage signal detected by the SQUID element 2B. Then, the sweeping magnetic flux signal Φ and the voltage detection signal V are provided to the oscilloscope, and this allows observation of voltage vs. magnetic flux (Φ-V) characteristics of the SQUID element 2B, for example, as shown in FIG. 3-B, in visual on the screen of the oscilloscope.

Results of the Invention

Figure 3A:
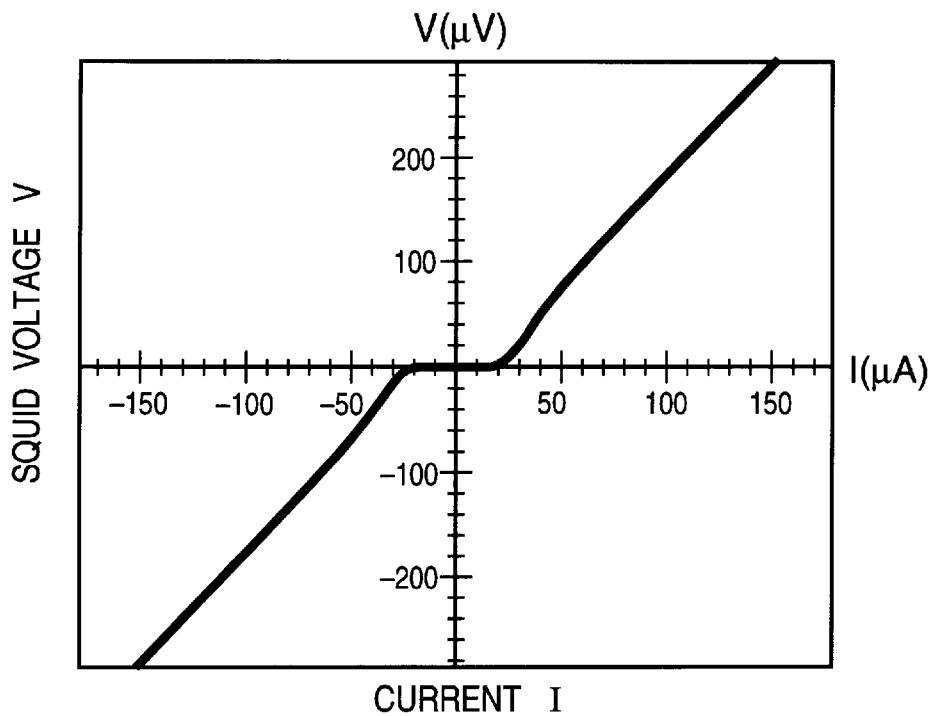
FIGS. 3A and 3B are graphs which illustrate SQUID voltage (V) vs. current (I) and magnetic flux (Φ) characteristics as examples of characteristics obtained by a circuit according to an embodiment of the present invention.
Figure 3B:
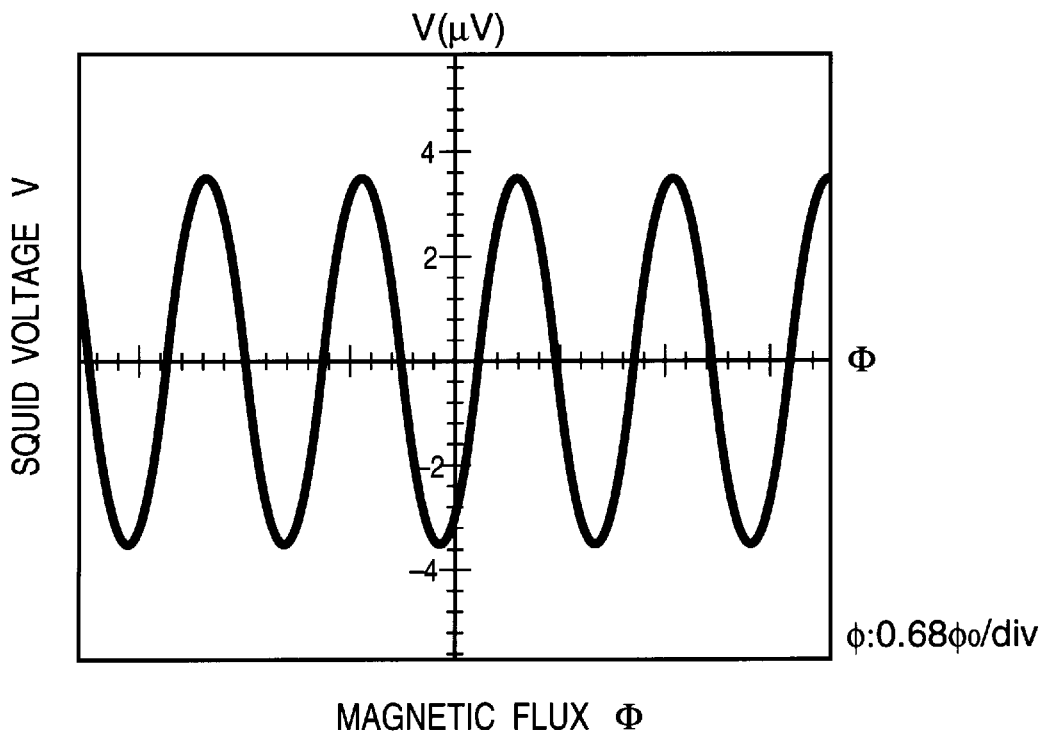

The circuit device according to the present invention including the above mentioned evaluator circuit allows for the oscilloscope to display the fundamental characteristics of the SQUID sensor or element 2A or 2B, such as V-I and V-Φ characteristics shown in FIGS. 3A and 3B, thereby to monitor SQUID parameters, such as critical current value, SQUID output voltage, and the like. Further, the circuit device is capable of providing a SQUID kit fit for experiments and demonstrations of SQUID operations in technical institutes. Consequently, it is expected that the circuit device will increase interest in applying the high-temperature superconductor SQUID to electronics, and facilitate the research of further new applications of the high-temperature semiconductor SQUID.

We claim:

1. A circuit device for driving a magnetometric sensor comprising:

a magnetometer circuit including a magnetic flux locked loop of magnetic flux modulation type for driving a SQUID as a magnetometric sensor;

an evaluator circuit for evaluating characteristics of the SQUID; and a selector circuit for selecting a sensor function or an evaluator function, said magnetometer circuit comprising a first input/output terminal for transmitting and receiving signals to and from the SQUID element, an AC signal source for producing an AC signal to drive the SQUID element and the magnetometer circuit, and a measurement terminal for providing a magnetic field measurement signal on the basis of a detected signal inputted from the first input/output terminal, said evaluator circuit comprising a second input/output terminal for transmitting and receiving signals to and from the SQUID, an AC signal source for producing an AC signal to drive the SQUID and the evaluator circuit, and an evaluation terminal for providing a characteristics evaluation signal on the basis of the signal from the second input/output terminal, and said selector circuit activating one of said magnetometer circuit and said evaluator circuit when said selection circuit selects one of the sensor function and evaluator function.

2. A circuit device as claimed in claim 1, wherein said selector circuit applies a supply voltage selectively to only one of said magnetometer circuit and said evaluator circuit when said selector circuit selects a corresponding one of the sensor function and the evaluator function.

3. A circuit device as claimed in claim 1, wherein:

each of said first and second input/output terminals includes a transmitting terminal for exciting a coil combined with the SQUID;

the coil is provided to act as a feedback coil for applying a feedback magnetic field corresponding to the detected signal to the SQUID when the sensor function is selected; and the coil is further provide to act as a magnetic field applying coil for applying a magnetic field for obtaining the SQUID characteristics to the SQUID when the evaluator function is selected.

4. A circuit device as claimed in claim 2, wherein:

each of said first and second input/output terminals includes a transmitting terminal for exciting a coil combined with the SQUID;

the coil is provided to act as a feedback coil for applying a feedback magnetic field corresponding to the detected signal to the SQUID when the sensor function is selected; and the coil is further provide to act as a magnetic field applying coil for applying a magnetic field for obtaining the SQUID characteristics to the SQUID when the evaluator function is selected.

5. A circuit device as claimed in claim 1, wherein:

said first input/output terminal is formed by a connecter receptacle for receiving an end of a signal cable connected to the SQUID;

said evaluation terminal is formed by a connector receptacle for receiving an end of a signal cable connected to a graphic display; and, when the evaluator function is selected, the characteristics evaluating signal appears on said evaluation terminal to display at least voltage vs. current and voltage vs. magnetic flux characteristics of the SQUID.

6. A circuit device claimed in claim 2, wherein:

said first input/output terminal is formed by a connecter receptacle for receiving an end of a signal cable connected to the SQUID;

said evaluation terminal is formed by a connector receptacle for receiving an end of a signal cable connected to a graphic display; and, when the evaluator function is selected, the characteristics evaluating signal appears on said evaluation terminal to display at least voltage vs. current and voltage vs. magnetic flux characteristics of the SQUID.

7. A circuit device as claimed in claim 3, wherein:

said first input/output terminal is formed by a connecter receptacle for receiving an end of a signal cable connected to the SQUID;

said evaluation terminal is formed by a connector receptacle for receiving an end of a signal cable connected to a graphic display; and, when the evaluator function is selected, the characteristics evaluating signal appears on said evaluation terminal to display at least voltage vs. current and voltage vs. magnetic flux characteristics of the SQUID.

8. A circuit device as claimed in claim 4, wherein:

said first input/output terminal is formed by a connecter receptacle for receiving an end of a signal cable connected to the SQUID;

said evaluation terminal is formed by a connector receptacle for receiving an end of a signal cable connected to a graphic display; and, when the evaluator function is selected, the characteristics evaluating signal appears on said evaluation terminal to display at least voltage vs. current and voltage vs. magnetic flux characteristics of the SQUID.

9. A circuit device as claimed in claim 1, wherein said SQUID is formed with an oxide type high-temperature superconductor.

10. A circuit device as claimed in claim 2, wherein said SQUID is formed with an oxide type high-temperature superconductor.

11. A circuit device as claimed in claim 3, wherein said SQUID is formed with an oxide type high-temperature superconductor.

12. A circuit device as claimed in claim 4, wherein said SQUID is formed with an oxide type high-temperature superconductor.

13. A circuit device as claimed in claim 5, wherein said SQUID is formed with an oxide type high-temperature superconductor.

14. A circuit device as claimed in claim 6, wherein said SQUID is formed with an oxide type high-temperature superconductor.

15. A circuit device as claimed in claim 7, wherein said SQUID is formed with an oxide type high-temperature superconductor.

16. A circuit device as claimed in claim 8, wherein said SQUID is formed with an oxide type high-temperature superconductor.

* * * * *